US011799460B1

(12) United States Patent
Srinivasan Gopalan et al.

(10) Patent No.: US 11,799,460 B1
(45) Date of Patent: Oct. 24, 2023

(54) DYNAMIC PHASE ADJUSTMENT FOR HIGH SPEED CLOCK SIGNALS

(71) Applicant: Texas Instruments Incorporated, Dallas, TX (US)

(72) Inventors: Madusudanan Srinivasan Gopalan, Issaquah, WA (US); Christopher Schell, Tacoma, WA (US); Benyong Zhang, Auburn, WA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/853,085

(22) Filed: Jun. 29, 2022

(51) Int. Cl.
| H03K 5/08 | (2006.01) |
| H03K 5/01 | (2006.01) |
| H03K 21/02 | (2006.01) |
| G06F 1/12 | (2006.01) |
| H03K 3/037 | (2006.01) |
| H03K 5/00 | (2006.01) |

(52) U.S. Cl.
CPC ............... *H03K 5/01* (2013.01); *G06F 1/12* (2013.01); *H03K 3/037* (2013.01); *H03K 21/02* (2013.01); *H03K 2005/00058* (2013.01)

(58) Field of Classification Search
CPC .......... H03K 5/01; H03K 3/037; H03K 21/02; H03K 2005/00058; G06F 1/12
USPC ........................................................ 327/327
See application file for complete search history.

(56) References Cited

U.S. PATENT DOCUMENTS

| 6,498,617 B1 * | 12/2002 | Ishida ................ G06K 15/1209 347/240 |
| 7,145,579 B2 * | 12/2006 | Arai ....................... G09G 1/285 345/691 |
| 8,258,839 B2 | 9/2012 | Erdogan |
| 2018/0131378 A1 | 5/2018 | Haroun et al. |

(Continued)

OTHER PUBLICATIONS

"JESD204B Survival Guide" (Analog Devices, Inc., 2014).

(Continued)

*Primary Examiner* — Ryan Jager
(74) *Attorney, Agent, or Firm* — Valerie M. Davis; Frank D. Cimino

(57) ABSTRACT

A clock generator circuit including an integer divider, having a first input receiving a reference clock and configured to generate an intermediate clock at a frequency divided down from a frequency of the reference clock by an integer value, a digital delay stage configured to generate a delayed intermediate clock delayed from the intermediate clock by a number of fractional cycles of the reference clock selected responsive to a fractional cycle value, and an analog delay stage configured to generate an output clock delayed from the delayed intermediate clock by a delay value selected responsive to a fine adjustment value. The clock generator circuit further includes math engine circuitry configured to compute a phase adjustment code responsive to the phase adjustment word, the phase adjustment code comprising the integer value, the fractional cycle value, and the fine adjustment value. The clock generator circuit may be implemented in a clock domain of a system along with one or more other clock generator circuits that each generate an output clock based on a reference clock generated by a reference clock source, such as a phase-locked loop.

20 Claims, 7 Drawing Sheets

(56) References Cited

U.S. PATENT DOCUMENTS

2021/0111727 A1   4/2021   Pahkala et al.

OTHER PUBLICATIONS

"LMK0482x Ultra Low-Noise JESD204B Compliant Clock Jitter Cleaner with Dual Loop PLLs," Datasheet SNAS605AS (Texas Instruments Incorporated, 2020).

"What to Know About the Differences Between JESD204B and JESD204C," Technical White Paper SBAA517 (Texas Instruments Incorporated, Jun. 2021).

"JESD204B Overview," Training Document SLAP161 (Texas Instruments Incorporated, 2016).

Staszewski et al., "All-Digital PLL With Ultra Fast Settling," Trans. Circ. Sys.—II: Express Briefs, vol. 54, No. 2 (IEEE, 2007), pp. 181-185.

Tierno et al., "A DPLL-based per Core Variable Frequency Clock Generator for an Eight-Core POWER7 Microprocessor," Technical Digest of Technical Papers, 2010 Symp. on VLSI Circ. (IEEE, 2010), pp. 85-86.

Tierno et al., "A Wide Power Supply Range, Wide Tuning Range, All Static CMOS All Digital PLL in 65 nm SOI," J. Solid State Circ., vol. 43, No. 1 (IEEE, 2008), pp. 42-51.

Yang et al., "A High-Frequency Phase-Compensation Fractional-N Frequency Synthesizer," 2005 IEEE International Symposium on Circuits and Systems (ISCAS), vol. 5 (IEEE, 2005), pp. 5091-5094.

\* cited by examiner

DYNAMIC PHASE ADJUSTMENT FOR HIGH SPEED CLOCK SIGNALS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This relates to the generation and adjustment of clock signals in or among integrated circuits, and more specifically relates to phase adjustment of a clock signal in a clock domain having multiple clock generators.

Many modern electronic systems include one or more integrated circuits that operate synchronously, both internally and among one another, based on a number of clock signals, often of various frequencies and phase relationships. These clock signals are commonly generated from a reference clock signal, which may be externally provided or generated in one of the system integrated circuits. Circuits and devices to be synchronized with one another may have their specific clock signals based on the same reference clock signal. Even so, as operating speeds and frequencies continue to increase with improvements in the capabilities of integrated circuits, constraints on clock parameters such as noise, jitter, duty cycle stability, and the like have become more stringent.

One particular system application in which accurate high speed clock distribution is especially critical is in serial interfaces between integrated circuits. Serial interfaces have become especially attractive for data communication between data converters such as analog-to-digital converters (ADCs) and digital-to-analog converters (DACs), on one hand, and logic devices such as field-programmable gate arrays (FPGAs) or application-specific integrated circuits (ASICs), on the other hand. In contrast to parallel data interfaces, serial interfaces reduce the number of conductors in the interface and thus reduces and simplifies circuit board area, reduces the package sizes of the integrated circuits, and is readily scalable to higher data rates. High-speed serial interface standards have been adopted in the industry, one example of which is low voltage differential signaling (LVDS) standard TIA/EIA-644 promulgated by the Telecommunications Industry Association (TIA) and the Electronics Industries Alliance (EIA).

Another serial interface standard that is proving to be particularly useful for interfaces between data converters and logic devices has been promulgated by the Joint Electron Devices Engineering Council (JEDEC) as JEDEC standard (JESD) JESD204A, JESD204B, and JESD204C (all of which are hereby incorporated by reference in their entirety). The JESD204 standards provide serial data rates of up to 12.5 gigabits per second (Gbps) while achieving deterministic latency across the serial links. Data octets are encoded into ten-bit symbols ("8b/10b" encoding) for synchronization of serializers/deserializers (SerDes), clock recovery, and direct current (DC) balance. A common JESD204B/C implementation includes a clock generator circuit, such as a digital phase-locked loop (DPLL), from which a device clock (or "device clock signal") and a system reference clock (or "system reference clock signal") is generated for each device with a serial interface. For example, eight devices in the system may reside in a single clock or DPLL "domain," in which the device clocks and system reference clocks are based on one reference clock (e.g., the clock output by one PLL).

Within a given clock domain, such as in a JESD204B/C system, dynamic or on-the-fly adjustment of the phase of one of the generated device clocks or system reference clocks may be necessary during operation. In conventional JESD204B/C systems, such dynamic phase adjustment of one device clock in a clock domain requires all other clocks in the clock domain to be stopped, restarted, and resynchronized. If phase adjustment is to be applied to a system reference clock, the system reference modules throughout the clock domain must be shut down and resynchronized after the phase offset is applied. In either case, dynamic clock phase adjustment at one device necessarily involves all devices and clocks in the clock domain, which as a result reduces system performance, utilization, and efficiency.

It is within this context that the embodiments described herein arise.

BRIEF SUMMARY OF THE INVENTION

According to one aspect, a clock generator circuit includes an integer divider, having a first input receiving a reference clock and configured to generate an intermediate clock at a frequency divided down from a frequency of the reference clock by an integer value, a digital delay stage configured to generate a delayed intermediate clock delayed from the intermediate clock by a number of fractional cycles of the reference clock selected responsive to a fractional cycle value, and an analog delay stage configured to generate an output clock delayed from the delayed intermediate clock by a delay value selected responsive to a fine adjustment value. The clock generator circuit further includes math engine circuitry configured to compute a phase adjustment code responsive to the phase adjustment word, the phase adjustment code comprising the integer value, the fractional cycle value, and the fine adjustment value. The clock generator circuit may be implemented in a clock domain of a system along with one or more other clock generator circuits that each generate an output clock based on a reference clock generated by a reference clock source, such as a phase-locked loop.

According to another aspect, a method of generating an output clock based on a reference clock includes generating the output clock in a first plurality of output clock cycles at a frequency divided down from the frequency of the reference clock according to a divide ratio, receiving a phase adjustment word indicating a phase adjustment to be applied to the output clock and, based on that phase adjustment word, computing a phase adjustment code comprising at least one of an integer value component, a fractional cycle component, and a fine adjustment component. The method further includes applying at least one of the integer value, fractional cycle, and fine adjustment components to an integer divider, a digital delay stage, and an analog delay stage, respectively, in a clock generator, which generates a phase-offset output clock cycle. The method further includes then generating the output clock at a frequency divided down from the frequency of the reference clock according to the divide ratio in a second plurality of output clock cycles.

Technical advantages enabled by one or more of these aspects may or may not include accurately applying a phase offset or phase adjustment in the generation of an output clock, such as a device clock or system reference signal.

Another technical advantage enabled by one or more of these aspects may or may not include the application of the phase offset or adjustment to the generation of one clock in a clock domain without requiring the resetting and re-synchronizing of other clocks in that domain. In addition, dynamic phase correction, over a wide phase correction range at very fine fractional resolution, may be enabled, with that dynamic phase correction applied in as few as a single cycle of the output clock. Furthermore, these aspects can enable the phase offset to be applied with minimal timing glitches.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

The one or more embodiments described in this specification are implemented into clock generation circuitry, for example as used for JESD204B/C serial interfaces between integrated circuits, as it is contemplated that such implementation is particularly advantageous in that context. However, it is also contemplated that aspects of these embodiments may be beneficially applied in other applications, including electronic systems of various types as may be used in computing and communications applications, among others. Accordingly, it is to be understood that the following description is provided by way of example only, and is not intended to limit the true scope of this invention as claimed.

Figure 1A:
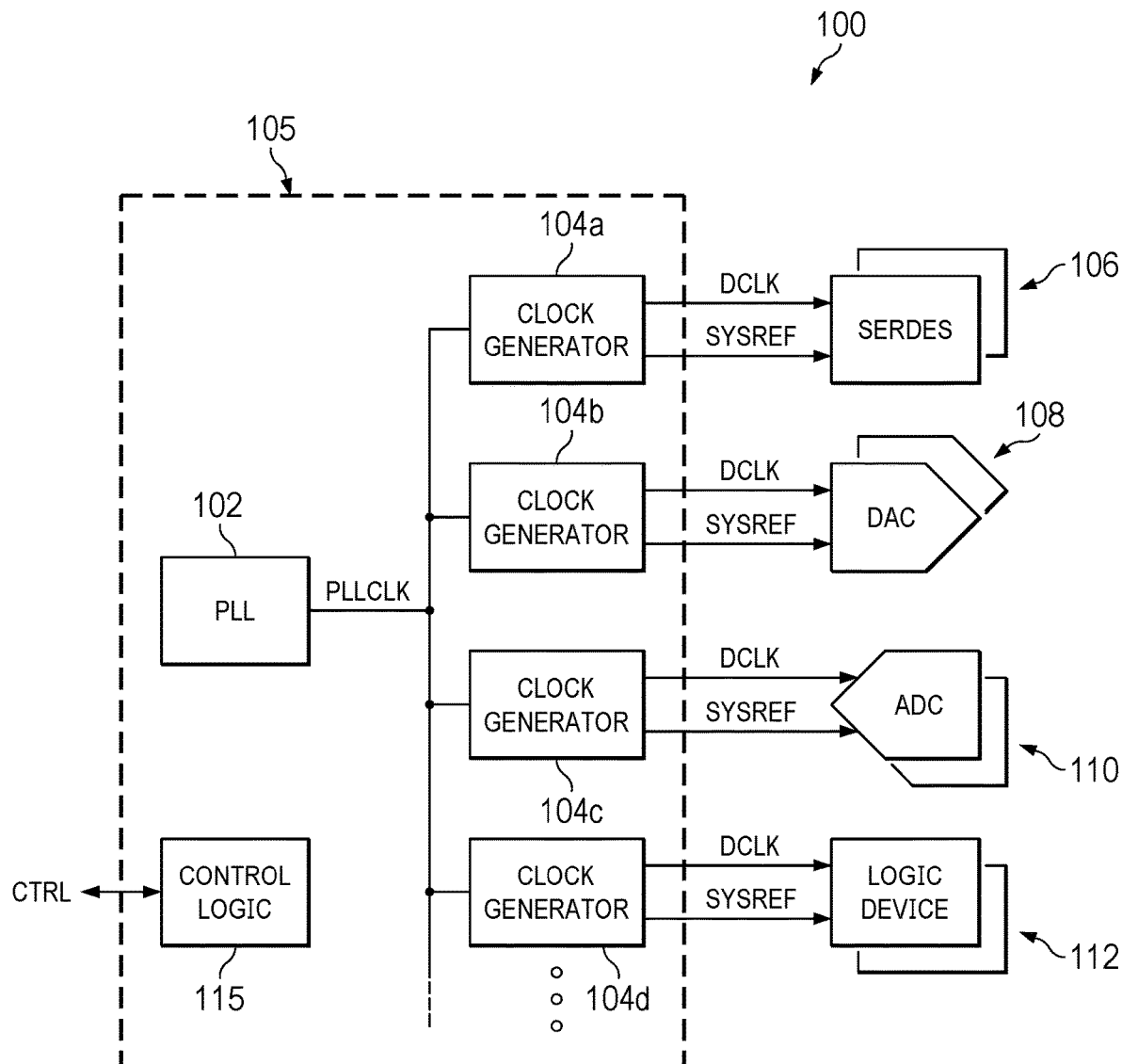
FIG. 1A is an electrical diagram, in block form, of at least a portion of an electronic system into which example embodiments may be implemented.

FIG. 1A illustrates the architecture of at least a portion of an electronic system 100 into which example embodiments may be implemented. In a general sense, system 100 represents a clock "domain" in which one or more integrated circuits each receive one or more clock signals based on the same reference clock PLLCLK, in this case as generated by a single phase-locked loop (PLL) 102. System 100 may include multiple clock domains similar to that shown in FIG. 1A, each such clock domain with one or more clock signals generated from a reference clock from a common reference clock source such as a PLL.

For the clock domain of system 100 shown in FIG. 1A, PLL 102 generates reference clock PLLCLK, upon which the clocking of multiple integrated circuit functions is based, for example to facilitate data communication among these functions. For example, system 100 of FIG. 1A may correspond to a JESD204B/C system. In this example, clock generators 104a, 104b, 104c, 104d, etc. (generically referred to as clock generator or generators 104) are provided in the same clock domain of system 100, and as such each clock generator 104 has an input receiving reference clock PLLCLK from PLL 102. For JESD204B/C communications, reference clock PLLCLK may be of relatively high frequency, such as on the order of several GHz. Clock generators 104 in this example each generate one or more clock signals based on reference clock PLLCLK, including one or more device clocks DCLK and a system reference signal SYSREF. For the example of JESD204B/C, device clock DCLK corresponds to a clock signal at a frequency divided down from reference clock PLLCLK, based upon which various circuit functions within an integrated circuit function may be clocked. Under JESD204B/C, system reference signal SYSREF is a clock signal that is generally at a lower frequency than device clocks DCLK (e.g., further divided down from reference clock PLLCLK by clock generators 104) and used for synchronizing framing among the various circuit functions within the same clock domain of system 100 (e.g., according to subclass 1 of the JESD204B standard). To facilitate such synchronization, the individual system reference signals SYSREF generated by each of clock generators 104a through 104d may all be at the same frequency, for example having a period that is the lowest common multiple of the periods of the various device clocks DCLK.

Control logic 115 may also be provided in system 100 in connection with clock generators 104. For example, control logic 115 may receive control signals CTRL from a controller or other logic circuitry in system 100, such control signals indicating a desired frequency relationship among the various device clocks DCLK and system reference signals SYSREF. In response, control logic 115 may store configuration or control words, for example in a control register, and may communicate control signals to clock generators 104 to set the appropriate frequencies and phase relationships. Control logic 115 may additionally operate to reset all clock generators 104 in a given clock domain, for example in response to receiving a reset code or signal over control signals CTRL.

In some examples, PLL 102 and clock generators 104, as well as control logic 115, may be implemented into a single integrated circuit, for example as shown in FIG. 1A by clock generator device 105. In such a device, PLL 102 may interface to an external crystal oscillator, or alternatively may include a integrated voltage-controlled oscillator and/or a bulk acoustic wave (BAW) device. In either case, the oscillator output of PLL 102 is distributed within clock generator device 105 to individual clock generators 104. Furthermore, while FIG. 1A specifically illustrates four clock generators 104a through 104d, more or fewer clock generators 104 may be provided for this clock domain.

FIG. 1A illustrates various examples of integrated circuit functions receiving clock signals generated by clock generators 104. In this implementation, one or more serializer/deserializer (SERDES) circuits 106 receive device clock DCLK and system reference signal SYSREF from clock generator 104a, one or more digital-to-analog converters (DACs) 108 receive device clock DCLK and system reference signal SYSREF from clock generator 104b, one or more analog-to-digital converters (ADCs) 110 receive device clock DCLK and system reference signal SYSREF from clock generator 104c, and one or more logic devices 112 receive device clock DCLK and system reference signal SYSREF from clock generator 104d. Integrated circuit functions 106, 108, 110, 112 may each be implemented in separate integrated circuits, or alternatively some of these functions may be fabricated to reside in the same integrated circuit as one another, or with clock generator device 105. The one or more logic devices 112 may, for example, be implemented as field-programmable gate array (FPGA) devices or application-specific integrated circuits (ASICs). As noted above, the clock generation arrangement of FIG. 1A may support data communications among the various integrated circuit functions 106, 108, 110, 112 according to the JESD204B/C standards, in which case serial interfaces will be provided among those functions.

Figure 1B:
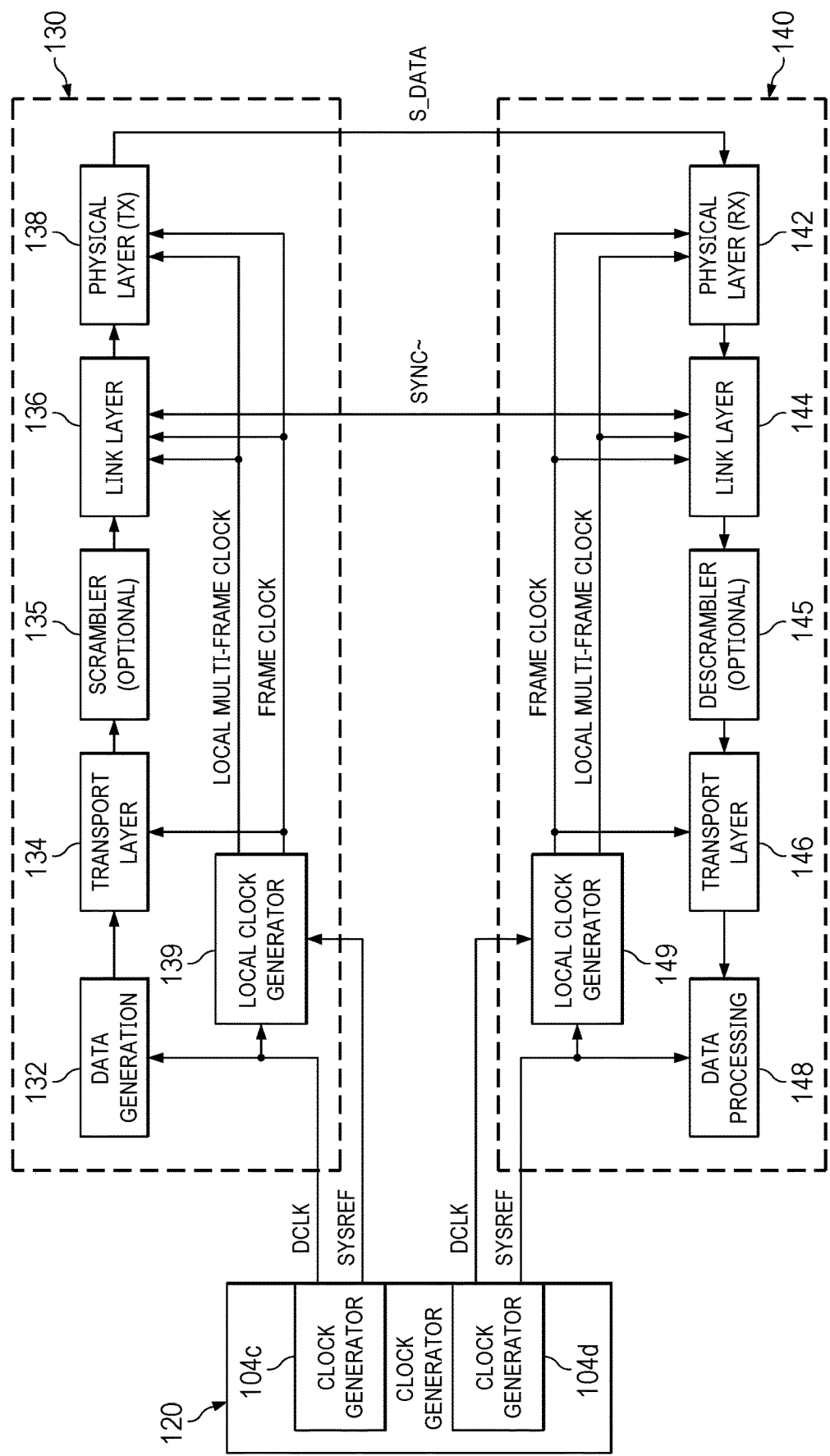
FIG. 1B is an electrical diagram, in block form, of a pair of integrated circuit functions within a clock domain of the system of FIG. 1A, and communicating with one another over a serial interface.

FIG. 1B illustrates, in further detail, an example of a serial interface between two integrated circuit functions in system 100 according to an example embodiment. In this example of FIG. 1B, data communications are carried out over serial data bus S_DATA between integrated circuit 130, operating as a transmitter, and integrated circuit 140, operating as a receiver. The particular function represented by each of integrated circuits 130 and 140 may vary, depending on the particular implementation. For example, integrated circuit 130 of FIG. 1B may correspond to an instance of ADC 110 of FIG. 1A, while integrated circuit 140 may correspond to an instance of logic device 112. Of course, additional instances of serial communications will be present in system 100, including perhaps a reverse communications link with integrated circuit 140 operating as a transmitter and integrated circuit 130 operating as a receiver.

Transmitter integrated circuit function 130 ("transmitter circuit") in this example includes data generation circuitry 132, which includes digital and/or analog circuitry for executing the specific data processing operation of transmitter circuit 130. For example, if transmitter circuit 130 is an instance of ADC 110, data generation circuitry 132 may include analog and digital circuitry for receiving and converting an analog input signal into a digital output word. FIG. 1B further illustrates the architecture of transmitter circuit 130 involved in the serial data communication of the output of data generation circuitry 132 to receiver circuit 140 over serial data interface S_DATA. In this example, transport layer circuitry 134 is coupled to data generation circuitry 132 to receive parallel digital data, and map that data into a serial data stream along with other transport layer operations. Scrambler circuitry 135 is optionally provided to scramble the serial data stream from transport layer circuitry 134 to improve symbol error rate. Link layer circuitry 136 receives the serial data stream from transport layer circuitry 134 or scrambler circuitry 135, as the case may be, and performs such link layer functions as 8b/10b encoding, alignment character insertion, link synchronization with receiver integrated circuit function 140, and the like. Physical layer circuitry 138 receives the processed serial data stream from link layer circuitry 136 and provides such transmitter functions as physical layer data serialization and data transmission over serial data interface.

Receiver integrated circuit function 140 ("receiver circuit 140") effectively reverses the transmission function of transmitter function 130 in this example. As such, receiver circuit 140 includes physical layer circuitry 142, which deserializes the serial data stream received by receiver circuit 140 over serial data interface S_DATA. Link layer circuitry 144 performs the receiver link layer functions including 8b/10b decoding, character replacement, and the like, and serves as the link layer synchronization master with link layer circuitry 136 of transmitter circuit 130 as the slave. Descrambler circuitry 145 is optionally provided to descramble the serial data stream from link layer circuitry 144 for those transmissions that are scrambled at the transmitter (e.g., by scrambler circuitry 135). Transport layer circuitry 136 is provided to perform transport layer processing on the serial data from link layer circuitry 144 or descrambler circuitry 145, as the case may be, such transport layer processing including mapping of serial data to parallel data for processing by data processing circuitry 148 of receiver circuit 140. Data processing circuitry 148 includes such digital or analog circuitry appropriate to carry out the desired functionality of receiver circuit 140. For example, if receiver circuit 140 is an instance of logic device 112, data processing circuitry 148 may include such programmable or hard-wired logic circuitry configured to carry out the desired arithmetic and logical operations on the data received over serial data interface S_DATA.

Communications according to the JESD204B standard may be carried over the serial interface of FIG. 1B according to one of a number of subclasses according to the manner in which deterministic latency (e.g., constant, or known, latency) of the serial link may or may not be attained. According to subclass 0, deterministic latency is not achieved. In subclass 1, deterministic latency is achieved by using system reference clock signal SYSREF with strict timing. In subclass 2, deterministic latency is achieved by using a SYNC~ signal between receiver link layer circuitry 144 (as master) and transmitter link layer circuitry 136 (as slave). This description will primarily correspond to clock generation in a serial interface of subclass 1 of JESD204B, although the example embodiments are applicable to operation in either of the other JESD204B subclasses and to other communications and data processing technologies.

Clock generator circuitry 120 in the example of FIG. 1B may correspond to an instance of integrated circuit 105 including both PLL 102 and its clock generators 104; alternatively, clock generator circuitry 120 may correspond to one or more clock generators 104 along with an external or separate reference clock circuit (e.g., PLL 102). In this example, a clock generator 104c in clock generator circuitry 120 generates an instance of device clock DCLK and an instance of system reference signal SYSREF to transmitter circuit 130, and similarly a clock generator 104d generates an instance of device clock DCLK and an instance of system reference signal SYSREF to receiver circuit 140. These instances of device clock DCLK and system reference signal SYSREF produced by clock generator circuitry 120 are all based on the same reference clock signal (e.g., reference clock PLLCLK of FIG. 1A), and as such reside in the same clock, or PLL, domain.

Within transmitter circuit 130, data generation circuitry 132 receives the instance of device clock DCLK from clock generator 104c. Transmitter circuit 130 also includes local clock generator circuitry 139 that receives the instance of device clock DCLK along with an instance of system reference signal SYSREF from clock generator 104c. Local clock generator circuitry 139 may be constructed to include one or more additional frequency dividers and delay elements to generate various internal clock signals for distribution and use within transmitter circuit 130. For the example of transmitter circuit 130 operating according to the JESD204B/C standards, local clock generator circuitry 139 may generate one or more local multi-frame clock (LMFC) signals, and one or more frame clocks, for use in carrying out JESD204B/C transmission over serial data interface S_DATA. As shown in FIG. 1B, LMFC clocks generated by local clock generator circuitry 139 from device clock DCLK and system reference signal SYSREF may be applied to link layer circuitry 136 and physical layer circuitry 138, and a frame clock may be applied to transport layer circuitry 134, link layer circuitry 136, and physical layer circuitry 138, for example.

Within receiver circuit 140, data processing circuitry 148 receives the instance of device clock DCLK generated by a clock generator 104d in clock generator circuitry 120. Similar to transmitter circuit 130, receiver circuit 140 also includes local clock generator circuitry 149 that receives the instance of device clock DCLK and an instance of system reference signal SYSREF generated by clock generator 104d. Local clock generator circuitry 149 may be constructed to include one or more additional frequency dividers and delay elements to generate various internal clock signals for distribution and use within receiver circuit 140. For the example of transmitter circuit 140 operating according to the JESD204B/C standards, local clock generator circuitry 149 may generate one or more local multi-frame clock (LMFC) signals and one or more frame clocks, for use in receiving JESD204B/C communications over serial data interface S_DATA. As shown in FIG. 1B, LMFC clocks generated by local clock generator circuitry 149 from device clock DCLK and system reference signal SYSREF may be applied to physical layer circuitry 142 and link layer circuitry 144, and a frame clock may be applied to physical layer circuitry 142, link layer circuitry 144, and transport layer circuitry 146, for example.

During the operation of system 100 of FIG. 1A, it may become necessary or useful for one of clock generators 104 to apply a phase offset to either or both of the device clock DCLK or system reference signal SYSREF generated by that clock generator 104 from reference clock PLLCLK. For example, referring to the portion of system 100 shown in FIG. 1B, it may be necessary for the phase of device clock DCLK and/or system reference signal SYSREF generated by clock generator 104c for transmitter circuit 130 to be offset in order to attain or calibrate synchronization with receiver circuit 140. For purposes of this description, this phase offset advances or delays the phase of the device clock DCLK and/or system reference signal SYSREF within one of its cycles without necessarily changing its frequency in subsequent cycles. According to example embodiments, one or more of clock generators 104 is constructed and operate to permit dynamic and accurate application of such a phase offset at that clock generator 104, over a wide correction range, without affecting the operation of others of clock generators 104 in the same clock domain. In particular, according to these example embodiments, it is not necessary to stop and restart all clock generators 104, and thus all device clocks and system reference signals, in the clock domain in order to change the phase offset of one device clock DCLK or system reference signal SYSREF. Clock generators 104 according to these example embodiments may further be constructed and operate to deterministically apply such phase offset without "glitches" in the timing and with a fixed latency.

Figure 2:
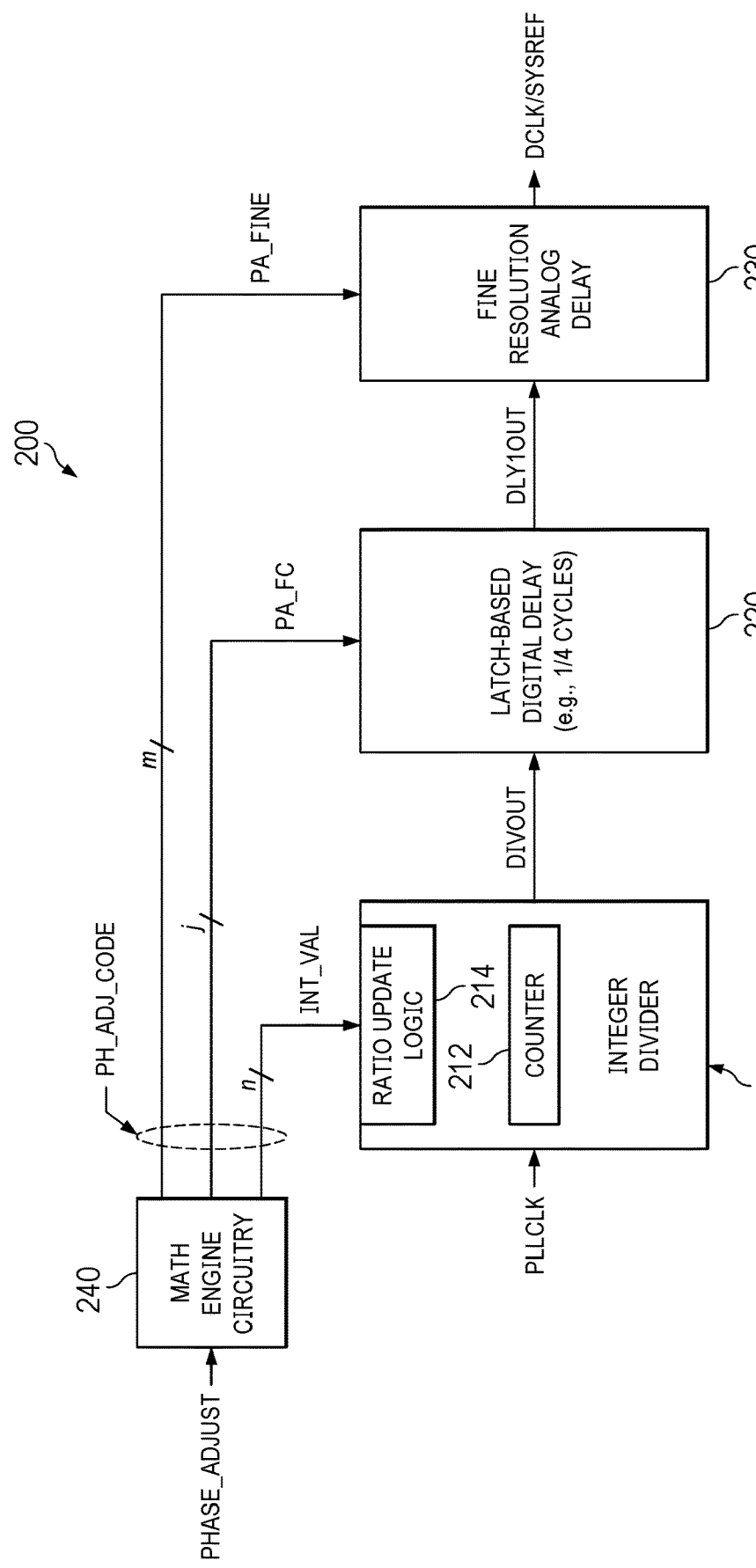
FIG. 2 is an electrical diagram, in block form, of a clock generator in the system of FIG. 1A and FIG. 1B according to example embodiments.

FIG. 2 illustrates the generalized construction of clock generator 200 according to example embodiments. Clock generator 200 of FIG. 2 may be used to implement any or all of clock generators 104 in system 100 of FIG. 1A. As will be evident from this description, clock generator 200 according to example embodiments is constructed and operates to generate a device clock DCLK and/or system reference signal SYSREF, as the case may be, based on a higher-frequency reference clock PLLCLK such as may be generated by PLL 102 (FIG. 1A), to which a selected high-resolution phase offset may be dynamically applied.

According to the example of FIG. 2, clock generator 200 includes integer divider 210 having an input receiving reference clock PLLCLK. Integer divider 210 may be constructed to include synchronous counter 212, which may be either an up counter or a down counter. Counter 212 is clocked by reference PLLCLK, and generates logic transitions at its output, as intermediate clock DIVOUT, after the receipt of a selected number of cycles of reference clock PLLCLK. As such, intermediate clock signal DIVOUT, as generated by integer divider 210, has a frequency divided down from that of reference clock PLLCLK by a selectable integer value (for example an integer ranging from 2 to $2^{n-1}$, where n is the number of bits of the synchronous counter). According to this example implementation, the divide ratio of integer counter 210 is selectable over a wide frequency range but with relatively coarse resolution, in that the period of intermediate clock DIVOUT is an integer multiple of the period of reference clock PLLCLK.

Digital delay stage 220 has an input coupled to receive intermediate clock DIVOUT from the output of integer divider 212. In this example implementation, digital delay stage 220 is a latch-based digital delay stage providing at its output a delayed intermediate clock DLY1OUT, delayed from intermediate clock DIVOUT by a selected delay interval. In one example implementation, digital delay stage 220 may provide a delay that is selectable in steps of half-cycles of the period of reference clock PLLCLK. As such, the delay insertable by digital delay stage 220 has a finer resolution than integer divider 210, but over a narrower range (e.g., ten or fewer periods of reference clock PLLCLK).

Analog delay stage 230 has an input coupled to receive delayed intermediate clock DLY1OUT from the output of digital delay stage 220. In this example implementation, analog delay stage 230 may be a phase interpolator configured and operating to provide, at its output, an output clock (e.g., device clock DCLK and/or system reference signal SYSREF) that is delayed from delayed intermediate clock DLY1OUT by a selected delay interval. In one example implementation, the delay applied by analog delay stage 230 may be selectable among a number of steps (e.g., thirty-one or sixty-three steps) within a half-cycle or full cycle of the period of reference clock PLLCLK. Considering that reference clock PLLCLK will be of a higher frequency than the output clock generated by clock generator 200, the delay insertable by analog delay stage 230 can have a very fine resolution over a very narrow range, as compared with integer divider 210 and digital delay stage 220. For the example of reference clock PLLCLK at a frequency on the order of 1 GHz, the delay inserted by analog delay stage 230 may be selectable at a resolution of less than 10 ps.

According to example embodiments, clock generator 200 is configured and operates to dynamically apply a phase offset or adjustment through the cooperative operation of integer divider 210, digital delay stage 220, and analog delay stage 230. (For purposes of this description, the terms "phase offset" and "phase adjustment" will be used synonymously.) In addition, example embodiments are capable of fully applying this phase offset within one output clock cycle.

To accomplish this phase adjustment according to example embodiments, clock generator 200 includes math engine circuitry 240, which has an input coupled to receive a digital word PHASE_ADJUST corresponding to the desired phase offset or adjustment to be applied to the output clock. Phase adjustment word PHASE_ADJUST may be provided by control logic 115, for example based on control signals CTRL, or from other control circuitry in or user input to system 100. Math engine circuitry 240 may include logic circuitry, such as programmable or hard-wired logic circuitry, programmed or configured to convert values of digital word PHASE_ADJUST to a phase adjustment code PH_ADJ_CODE that may be applied to integer divider 210, digital delay stage 220, and analog delay stage 230.

In the example of FIG. 2, phase adjustment code PH_ADJ_CODE includes an n-bit integer component INT_VAL communicated to ratio update logic 214 in integer divider 210. Phase adjustment code PH_ADJ_CODE also includes a j-bit fractional-cycle component PA_FC communicated to digital delay stage 220, and a k-bit fine adjustment component PA_FINE communicated to analog delay stage 230. In an example implementation, these three phase adjustment components may be communicated and applied in a single cycle of the output clock (e.g., device clock DCLK or system reference signal SYSREF, as the case may be), to adjust the phase of that output clock in that cycle and subsequent cycles. Alternatively, the phase adjustment may be ramped to be incrementally applied over a number of output clock cycles.

Figure 3:
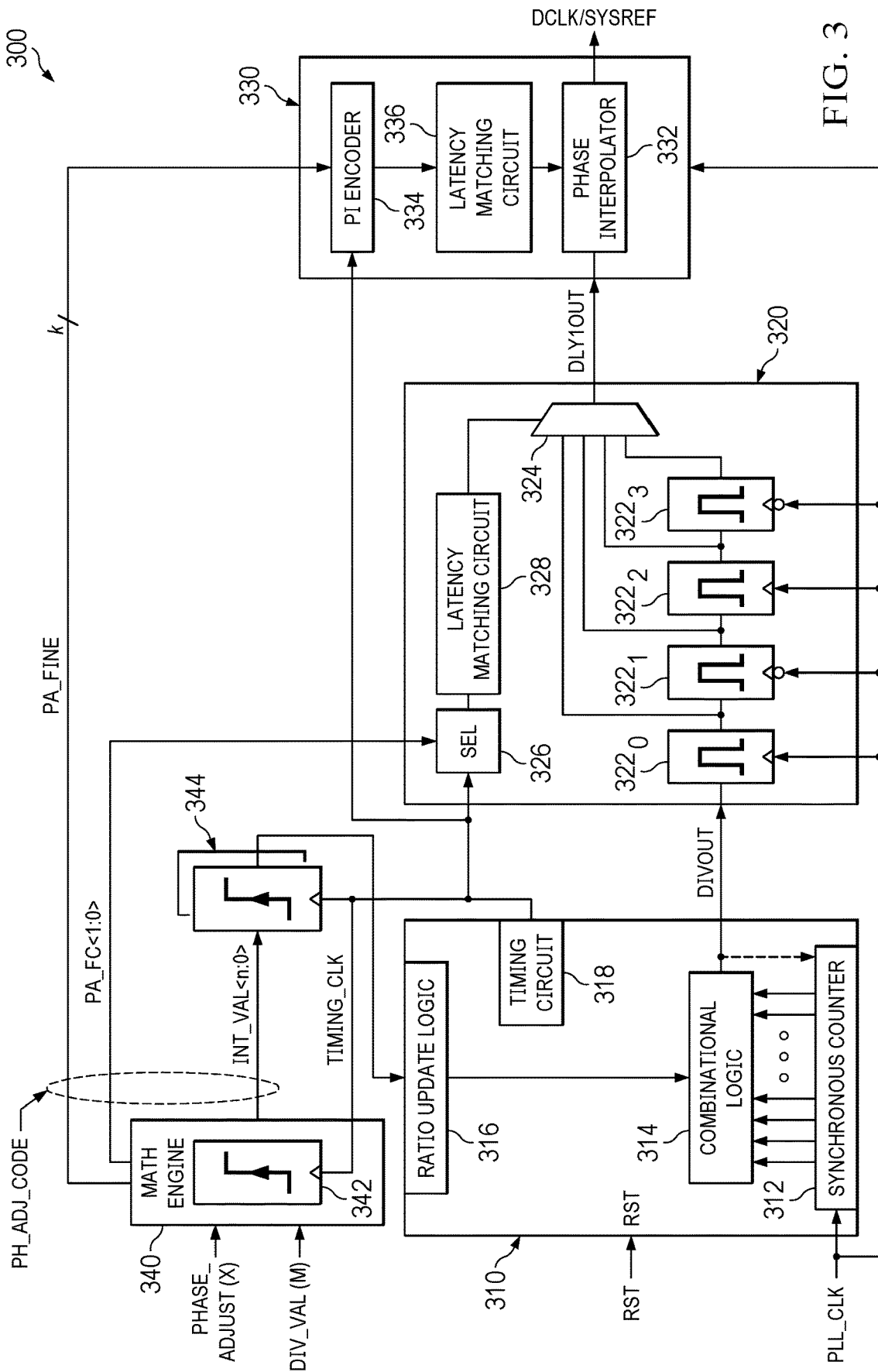
FIG. 3 is an electrical diagram, in block form, of the clock generator of FIG. 2 according to an example embodiment.

FIG. 3 illustrates the construction of clock generator 300, as an example of the more generalized architecture of clock generator 200 of FIG. 2. Accordingly, clock generator 300 may be used to implement any or all of clock generators 104 in system 100 of FIG. 1A, and as such is constructed and operates to generate a device clock DCLK and/or system reference signal SYSREF, as the case may be, based on a higher-frequency reference clock PLLCLK such as may be generated by PLL 102 (FIG. 1A).

Integer divider 310 in this example includes synchronous counter 312, which in this example is an "up" counter with an input receiving reference clock PLLCLK, although synchronous counter 312 may alternatively be implemented as a "down" counter. In this example, synchronous up counter 312 maintains a count that is advanced in response to each cycle of reference clock PLLCLK. Counter 312 has multiple outputs, for example one output for each bit position, each coupled to a corresponding input of combinational logic 314. In this example in which synchronous counter 312 is an up counter, combinational logic 314 determines whether the current contents of counter 312 indicate the receipt of a selected number of cycles of reference clock PLLCLK and, if so, generates a logic level transition at its output as intermediate clock DIVOUT. In this example, counter 312 may be reset upon combinational logic 314 reaching the selected value, for example reset by a rising edge of intermediate clock DIVOUT.

Integer divider 310 further includes ratio update logic 316, which is constructed to select the number of cycles to be detected by combinational logic 314 in each cycle, for example in response to an n-bit digital word INT_VAL generated by math engine circuit 340. In some implementations, ratio update logic 316 may be capable of changing the divide ratio applied by combinational logic 314 from a divide ratio M to a divide ratio M±X (e.g., for |M−X|>2) within a single cycle. Combinational logic 314 and ratio update logic 316 may be realized as synchronous logic, such that integer divider can deterministically "jump" from one divide ratio to another without causing a timing glitch, and at a fixed latency. In one implementation, the number of bits of counter 312 and combinational logic 314 may be sixteen. Also in this example, integer divider 310 may include the appropriate reset circuitry (not shown) configured to be reset to a known or determinate state on system startup, in response to receipt of a reset signal RST.

According to this example implementation, integer divider 310 also includes timing circuitry 318 constructed and operating to generate a timing signal TIMING_CLK, which may be generated within each cycle of the eventual output clock (e.g., device clock DCLK or system reference signal SYSREF), for example in response to combinational logic 314 issuing a transition of intermediate clock DIVOUT. Timing signal TIMING_CLK is provided to synchronize the operation of the components of integer counter 310, as will be described below.

In this example implementation, digital delay stage 320 includes a series of clocked latches $322_0$ through $322_3$ (generically referred to as clocked latches 322). First clocked latch $322_0$ in the series has a data input receiving intermediate clock DIVOUT. The output of each of clocked latches $322_0$, $322_1$, $322_2$ is coupled to the input of the next clocked latch $322_1$, $322_2$, $322_3$, respectively, in the series. Each clocked latch 322 has a clock input receiving reference clock PLL_CLK, with clocked latches $322_0$, $322_2$ triggered by the rising edge of reference clock PLL_CLK and clocked latches $322_1$, $322_3$ triggered by the falling edge of reference clock PLL_CLK. Accordingly, the state of intermediate clock DIVOUT is clocked along the series of clocked latches 322 with each half-cycle of reference clock PLLCLK. The output of each clocked latch 322 is coupled to a separate input of multiplexer 324, the output of which is forwarded to analog delay stage 330 as delayed intermediate clock DLY1OUT. In this example in which four clocked latches $322_0$ through $322_3$ are included in digital delay stage 320, digital delay stage 320 implements a delay that is selectable at a resolution of one half-cycle of reference clock PLLCLK, over a range of two full cycles of reference clock PLLCLK. More or fewer clocked latches 322 may be included in the series according to the desired correction range for digital delay stage 320. For example, if the resolution with which integer divider 310 can change its divide ratio from a divide ratio M to a divide ratio M±X is limited, for example only if |M−X|>2, additional clocked latches may be included in series in digital delay stage 320 (e.g., as many as ten, to provide a digital delay of as many as 20 half-cycles of reference clock PLLCLK). In addition, the clocking of clocked latches 322 may be differently arranged to obtain a different delay resolution (e.g., quarter-cycles).

Select circuit 326 of digital delay stage 320 has an input coupled to receive two-bit fractional-cycle digital word PA_FC<1:0>, for selecting the output of one of the four clocked latches $322_0$ through $322_4$ in this example. Select circuit 326 generates a select signal based on fractional-cycle digital word PA_FC<1:0>, in response to timing signal TIMING_CLK from integer divider 310. The select signal generated by select circuit 326 is delayed by latency matching circuit 328, for example constructed of a series of flip-flops, to match the latency of integer divider 310, with the delayed select signal then applied to a select input of multiplexer 324.

Analog delay stage 330 in this example implementation includes phase interpolator 332, which has an input receiving delayed intermediate clock DLY1OUT and an output presenting the output clock (e.g., device clock DCLK or system reference signal SYSREF) based on a phase interpolation of delayed intermediate clock DLY1OUT according to a phase interpolation code. An example of the construction of phase interpolator 332 as suitable for this implementation is described in commonly assigned U.S. Patent Application Publication No. US 2018/0131378, entitled "High Linearity Phase Interpolator," and incorporated herein by this reference. In the example of FIG. 3, phase interpolation (PI) encoder 334 has an input receiving k-bit fine adjustment digital word PA_FINE and, when clocked by timing signal TIMING_CLK, generating a corresponding PI code. This PI code is applied to latency matching circuit 336, which similarly as described above for latency matching circuit 328, delays the PI code from PI encoder 334 before application to phase interpolator 332 to match the latency of integer divider 310. Phase interpolator 332 is clocked by reference clock PLL_CLK. According to this example implementation, phase interpolator 332 generates the output clock by further delaying delayed intermediate clock DLY1OUT by a delay selectable within a narrow range. The value expressed by k-bit fine adjustment word PA_FINE may indicate the one of $2^{k-1}$ delay values that may be applied by phase interpolator 332 of analog delay stage 330, with those $2^{k-1}$ delay steps within a range of one half-cycle or one full cycle of reference clock PLL_CLK. For example, these delay steps may be as small as 5 psec or less. Accordingly, the resolution of delay applied by analog delay stage 330 is substantially finer than the half-cycle resolution of digital delay stage 320, but is selectable within a narrower range of available delays.

As described generally in connection with clock generator 200 of FIG. 2, clock generator 300 includes math engine circuitry 340 for generating phase adjustment code PH_ADJ_CODE, components of which are applied to integer counter 310, digital delay stage 320, and analog delay stage 330. In the example implementation of FIG. 3, math engine circuitry 340 has one input coupled to receive a digital word DIV_VAL indicating a divider ratio M to be applied by integer divider 310 in generating the output clock in normal cycles, and has another input receiving digital word PHASE_ADJUST corresponding to a phase offset or adjustment to be applied to the output clock, for example to calibrate device clock DCLK or system reference signal SYSREF with other clock signals in the clock domain. According to this example embodiment, this phase adjustment can be applied in a single output clock cycle, or may be applied over multiple successive cycles. Divider ratio word DIV_VAL and phase adjustment word PHASE_ADJUST may be provided by control logic 115, for example based on control signals CTRL, or from other control circuitry or based on user input to system 100. Math engine circuitry 340 may include logic circuitry, such as programmable or hard-wired logic circuitry, programmed or configured to convert values of digital words DIV_VAL and PHASE_ADJUST to a phase adjustment code PH_ADJ_CODE for application to integer divider 210, digital delay stage 220, and analog delay stage 230. According to this example embodiment, divider ratio word DIV_VAL indicates a divide ratio M to be applied by clock generator 300 in generating the output clock (e.g., device clock DCLK or system reference signal SYSREF, as the case may be) at a frequency divided down from reference clock PLLCLK by that divide ratio M. Phase adjustment word PHASE_ADJUST indicates a phase offset or adjustment X to be applied in generating the output clock, and may be either a positive or negative value according to this implementation. While divider ratio word DIV_VAL may express an integer number of reference clock PLLCLK cycles (i.e., the divide ratio), phase adjustment word PHASE_ADJUST may have both integer and fractional portions.

The logic circuitry of math engine circuitry 340 is configured and operates to convert divider ratio word DIV_VAL and phase adjustment word PHASE_ADJUST into phase adjustment code PH_ADJ_CODE. Phase adjustment code PH_ADJ_CODE in this example includes an n-bit integer component INT_VAL <n:0> that is forwarded to ratio update logic 316 in integer divider 310 (via clocked buffer 344 in this example), a two-bit fractional-cycle component PA_FC<1:0> that is forwarded to select circuit 326 of digital delay stage 320, and a k-bit fine adjustment component PA_FINE that is forwarded to PI encoder 334 in analog delay stage 330. Integer component INT_VAL indicates the count value used by combinational logic 314 to generate intermediate clock DIVOUT at a period that is an integer multiple M of the period of reference clock PLLCLK. Fractional-cycle component PA_FC indicates the selection of the one of clocked latches $322_0$ through $322_3$ to provide delayed intermediate clock DLY1OUT, representing a delay of one through four half-cycles of reference clock PLLCLK. Fine adjustment component PA_FINE indicates one of $2^{k-1}$ delays as the fine resolution delay value applied by analog delay stage 330.

According to the example implementation of FIG. 3, math engine circuitry 340 includes clocked buffer 342, which in this example controls the generating of phase adjustment code PH_ADJ_CODE synchronously with timing clock TIMING_CLK from integer divider 310. In this example, the timing at which phase adjustment code PH_ADJ_CODE is applied, in its components, to integer divider 310, digital delay stage 320, and analog delay stage 330 is also synchronized by timing clock TIMING_CLK from timing circuit 318. Specifically, the applying of integer component INT_VAL to ratio update logic 316 in integer divider 310 by clocked buffer 344, the applying of fractional-cycle component PA_FC to multiplexer 324 by select circuit 326, and the applying of fine adjustment component PA_FINE to phase interpolator 332 by PI encoder 334, are each clocked by timing clock TIMING_CLK. Each of digital delay stage 320 and analog delay stage 330 include a latency matching circuit 328, 336, respectively, which in each case is configured to delay the application of the phase adjustment code to match the latency of integer divider 310.

As noted above, clocked buffer 342 in math engine circuitry 340 is also clocked by timing clock TIMING_CLK. It is contemplated that clocked buffer 342 may clock the forwarding of the phase adjustment code PH_ADJ_CODE to the output of math engine circuitry 340 in one cycle (or half-cycle) of timing clock TIMING_CLK, while the application of phase adjustment code PH_ADJ_CODE to ratio update logic 316, multiplexer 324, and phase interpolator 332 is clocked in a next cycle (or half-cycle) of timing clock TIMING_CLK.

Figure 4A:
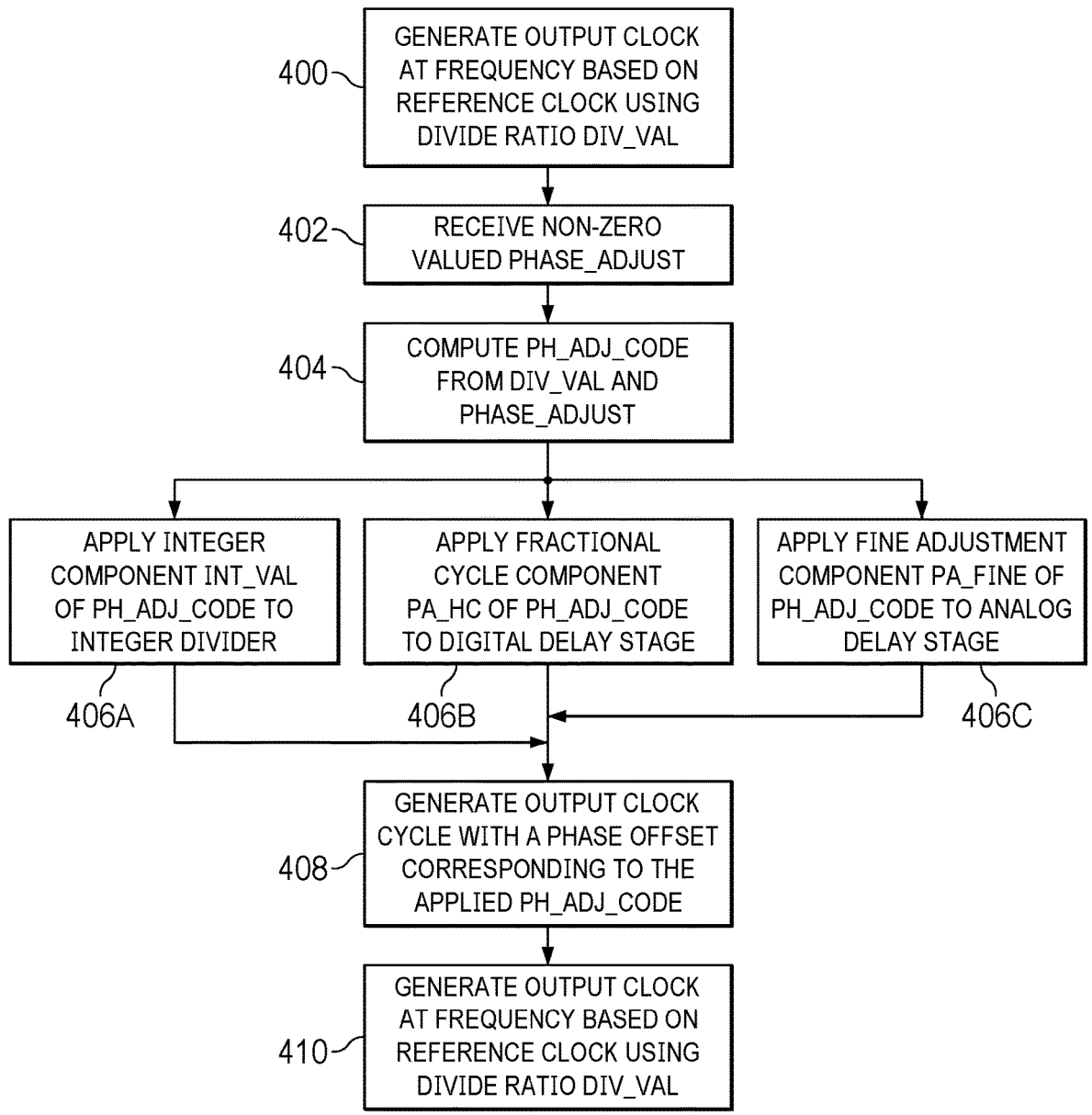
FIG. 4A is a flow diagram illustrating an example of the operation of the clock generator of FIG. 3 according to an example embodiment.

Referring to FIG. 4A in combination with FIG. 5, an example of the operation of clock generator 300 of FIG. 3 in making a phase adjustment in an output clock signal, in this case system reference signal SYSREF, will be described according to an example embodiment. It is to be understood that device clock DCLK in the context of system 100 of FIG. 1A, or a different type of clock or other periodic signal in other applications, may be adjusted in phase in a similar manner. According to this example, phase offset may be applied to system reference signal SYSREF within a single output cycle.

Figure 5:
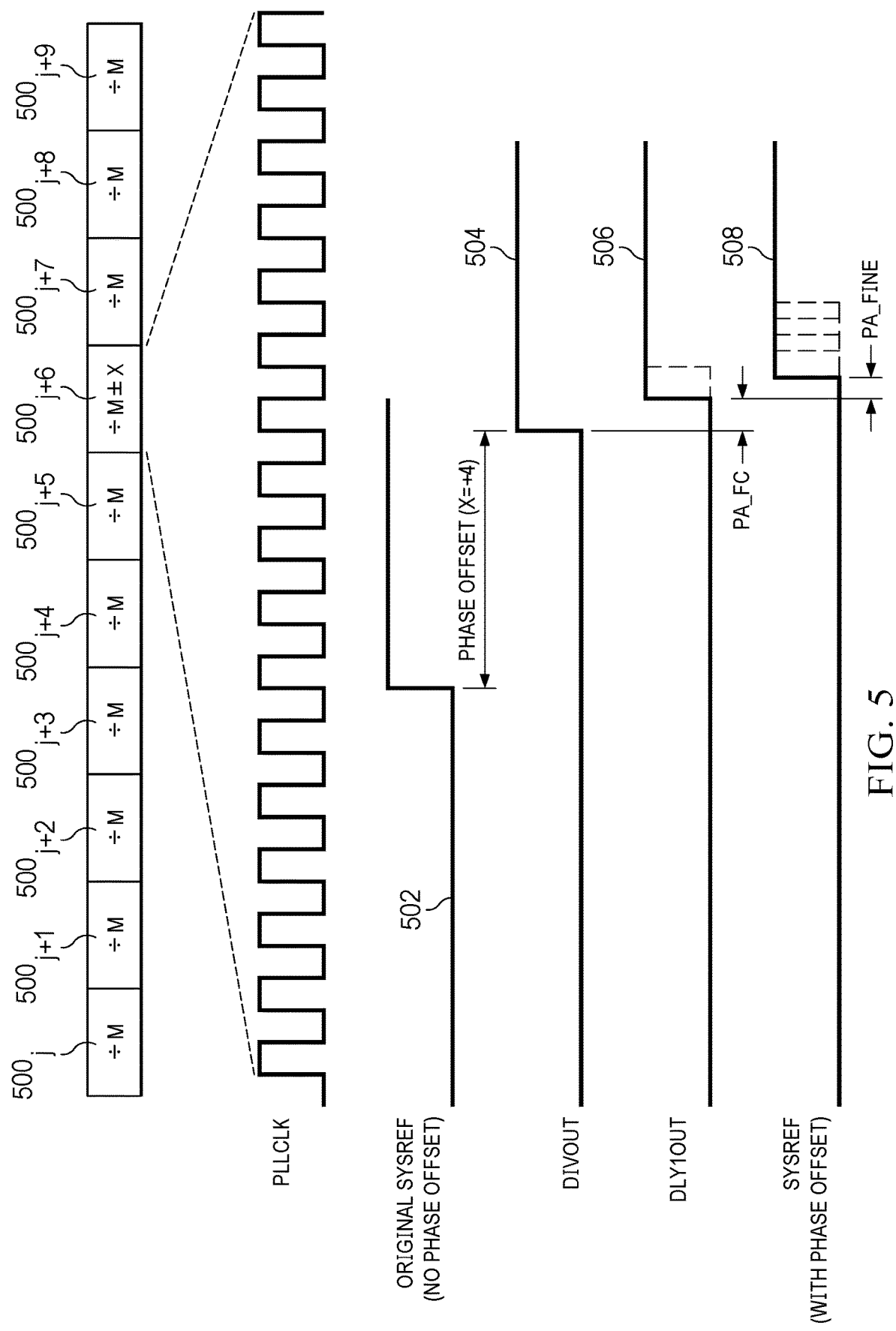
FIG. 5 is a timing diagram illustrating an example of the operation of the clock generator of FIG. 3 according to the example embodiment of FIG. 4A.

In process 400, clock generator 300 generates system reference signal SYSREF over a number of cycles in which the period of system reference signal SYSREF corresponds to an integer multiple M of the period of reference clock PLLCLK, as shown in FIG. 5 by cycles $500_j$ through $500_{j+5}$. In each of those cycles $500_j$ through $500_{j+5}$, integer divider 310 issues intermediate clock DIVOUT after M cycles of reference clock PLLCLK as indicated by divider ratio word DIV_VAL, with no phase offset applied (e.g., phase adjustment word PHASE_ADJUST has the value X=0). During these non-phase-adjusted cycles, digital delay stage 320 and analog delay stage 330 may each apply some selected delay, as may have been determined during calibration of clock generator 300. For the example of FIG. 5, divider ratio word DIV_VAL for cycles $500_j$ through $500_{j+5}$ has the value M=7.

In process 402, math engine circuitry 340 receives phase adjustment word PHASE_ADJUST with a non-zero value X, indicating that a phase offset is to be applied to system reference signal SYSREF in cycle $500_{j+6}$ and for subsequent cycles $500_{j+7}$ et seq. For the example of FIG. 4A, phase adjustment word PHASE_ADJUST has a value X=+4.625, which is to be applied to the value M=7 of divider ratio word DIV_VAL as received for the preceding cycles. In process 404, math engine circuitry 340 computes phase adjustment code PH_ADJ_CODE in response to the received phase adjustment word PHASE_ADJUST and divider ratio word DIV_VAL. According to this example embodiment, phase adjustment code PH_ADJ_CODE is composed of an integer component INT_VAL, a fractional-cycle component PA_FC, and a fine adjustment component PA_FINE.

For the example shown in FIG. 5, integer component INT_VAL for cycle $500_{j+6}$ has the value 11, corresponding to the previous divide ratio M=7 plus the integer portion X=4 of phase adjustment word PHASE_ADJUST. Fractional-cycle component PA_FC has a value (e.g., $01_2$) representing a digital delay of one half-cycle of reference clock PLLCLK, and fine adjustment component PA_FINE has a k-bit value representing an analog delay of one-eighth of a cycle of reference clock PLLCLK. Alternatively, to achieve the same phase offset, phase adjustment code PH_ADJ_CODE may have a decremented integer component INT_VAL value with a corresponding increase (e.g., by two additional half-cycles) in fractional-cycle component PA_FC, or may otherwise be spread out among integer divider 310, digital delay stage 320, and analog delay stage 330.

Integer component INT_VAL of phase adjustment code PH_ADJ_CODE is applied to integer divider 310 in process 406A, fractional-cycle component PA_FC is applied to digital delay stage 320 in process 406B, and fine adjustment component PA_FINE is applied to analog delay stage 330 in process 406C. As described above relative to FIG. 3, the application of these components to integer divider 310, digital delay stage 320, and analog delay stage 330 may be synchronized by timing clock TIMING_CLK generated by timing circuit 318 of integer divider 310.

FIG. 5 is a timing diagram (with time on the horizontal axis) illustrating the result of processes 406A, 406B, 406C. As shown by line 504 of FIG. 5, intermediate clock DIVOUT generated by integer divider 310 is delayed by four cycles of reference clock PLLCLK from when it would have been generated with no phase offset (line 502). Line 506 illustrates that delayed intermediate clock DLY1OUT is generated by digital delay stage 320 with a delay of one-half cycle following intermediate clock DIVOUT. Line 508 indicates system reference signal SYSREF as generated by analog delay stage 330, with a delay of one-eighth cycle of reference clock PLLCLK following delayed intermediate clock DLY1OUT. Because timing clock TIMING_CLK synchronizes the application of the components of phase adjustment code PH_ADJ_CODE to integer divider 310, digital delay stage 320, and analog delay stage 330, these three components of the phase adjustment can occur within a single cycle of system reference signal SYSREF, producing a phase-offset output clock cycle (e.g., system reference signal SYSREF in this example) with the applied phase adjustment in process 408.

As noted above, phase adjustment word PHASE_ADJUST may take a negative value X. In that case, math engine circuitry 340 may reduce the value of integer component INT_VAL from the value M of divider ratio word DIV_VAL to an available integer value, and generate fractional components PA_FC and PA_FINE as additive values to be added to that reduced integer value to arrive at the desired phase offset. For the example of a phase adjustment word PHASE_ADJUST of value X=−4.375 to be applied to divider ratio DIV_VAL having a value of M=7, math engine circuitry 340 may generate phase adjustment code PH_ADJ_CODE with an integer component INT_VAL of value 19 (M=7, plus the integer portion of X=4, minus 2 for the negative phase adjustment), a fractional-cycle component PA_FC representing a digital delay of three half-cycles of reference clock PLLCLK, and fine adjustment component PA_FINE representing an analog delay of one-eighth of a cycle of reference clock PLLCLK.

Following process 408 in which clock generator 300 generates a cycle of the output clock with the phase adjustment indicated by phase adjustment word PHASE_ADJUST, clock generator 300 executes process 410 in which subsequent output clock cycles are generated at the frequency indicated by divide ratio word DIV_VAL, but with the phase shifted from the operation of process 408. In the example of FIG. 5, for cycles $500_{j+7}$ following cycle $500_{j+6}$ in which phase offset was applied, phase adjustment word PHASE_ADJUST returns to a value X=0, along with divider ratio DIV_VAL remaining at the value M=7. As described above, integer divider 310 resets counter 312 upon issuing intermediate clock DIVOUT. Accordingly, the phase offset of system reference signal SYSREF that was applied in cycle $500_{j+6}$ remains for succeeding cycles $500_{j+7}$ et seq., each of those succeeding cycles having a period at the multiple M=7 of the period of reference clock PLLCLK. The phase of system reference signal SYSREF in these succeeding cycles $500_{j+7}$ et seq. will remain as adjusted in phase adjustment cycle $500_{j+6}$. Operation of the integrated circuit function (e.g., one of the functions such as SERDES 106, DAC 108, ADC 110, or logic device 112 in system 100 of FIG. 1A) then continues, using the phase-adjusted system reference signal SYSREF in this example.

Alternatively in some implementations, clock generator 300 may be configured and operate to apply the phase offset indicated by phase adjustment word PHASE_ADJUST over more than one output clock cycle in a ramped fashion. For example, math engine circuit 340 may compute a series of partial phase adjustment code PH_ADJ_CODE values that each correspond to a portion of the phase adjustment indicated by the value of phase adjustment word PHASE_ADJUST, and apply that series of partial phase adjustment code values to integer divider 310, digital delay stage 320, and analog delay stage 330 over each of a series of output clock cycles. Those partial phase adjustment code PH_ADJ_CODE values may provide reduced values for each of the integer component INT_VAL, fractional-cycle component PA_HC, and fine adjustment component PA_FINE, or may only provide non-zero values for one or two of those components. After the phase offset indicated by phase adjustment word PHASE_ADJUST has been fully applied, subsequent output clock cycles can then be generated at the previous divide ratio DIV_VAL (process 410).

Figure 4B:
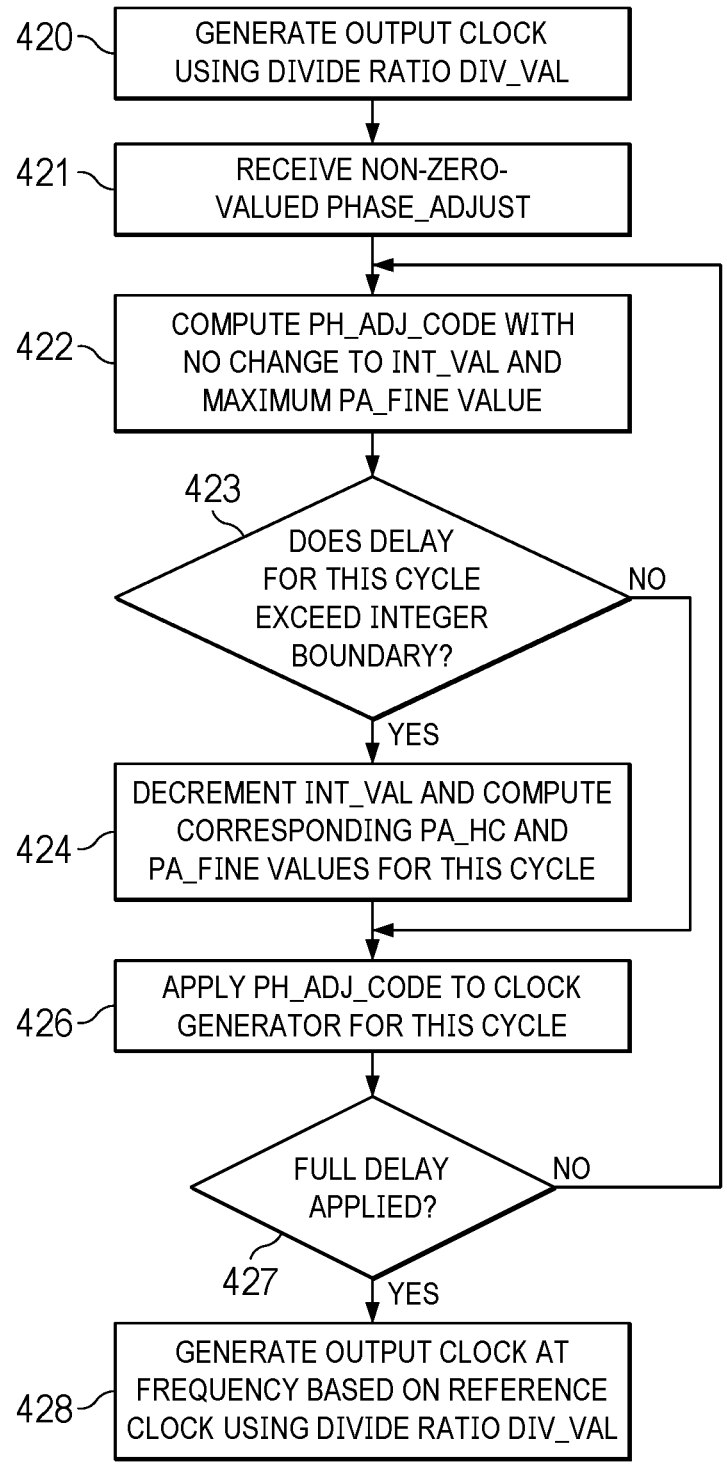
FIG. 4B is a flow diagram illustrating an example of the operation of the clock generator of FIG. 3 according to another example embodiment.

The flow diagram of FIG. 4B illustrates the operation of math engine circuit 340 to compute and apply such a ramped phase offset in clock generator 300 according to another example implementation. The operation of FIG. 4B in this example begins with process 420, in which a number of cycles of device clock DCLK and/or system reference signal SYSREF, as the case may be, are generated by clock generator 300 at a frequency divided down from that of reference clock PLLCLK by a nominal divider ratio DIV_VAL (e.g., while receiving a zero valued phase adjustment word PHASE_ADJUST).

In process 421, clock generator 300 receives an instance of phase adjustment word PHASE_ADJUST with a non-zero value X, indicating that a phase offset is to be applied to the output clock (e.g., system reference signal SYSREF). In process 422, math engine circuit 340 computes phase adjustment code PH_ADJ_CODE in response to the value of phase adjustment word PHASE_ADJUST in a form in which the integer component INT_VAL remains at its previous value (e.g., the value M of divider ratio DIV_VAL) with no change, and in which fine adjustment component PA_FINE is at its maximum value. According to this ramped implementation, therefore, the phase offset is applied over a number of cycles using the delay of analog delay stage 330; no additional delay or phase offset is applied by integer divider 310 or, in this example, digital delay stage 320.

It is, of course, possible that the maximum delay of analog delay stage 330 when applied to a current phase value may exceed the integer boundary of the output clock cycle (e.g., amount to a phase value>1). Decision 423 executed by math engine circuitry 340 determines if the delay computed in process 422 for the current output clock cycle exceeds the integer boundary. If so (decision 423 is "yes"), process 424 is performed to increment the value of integer component INT_VAL by 1, and to recompute the value of fine adjustment component PA_FINE to apply the appropriate analog delay amounting to the maximum analog delay, essentially "slipping" into the next output clock cycle. Process 426 is then executed to apply the phase adjustment code PH_ADJ_CODE with the incremented integer component INT_VAL and recomputed value of fine adjustment component PA_FINE (e.g., along with a zero value for fractional-cycle component PA_FC) to integer divider 310 and analog delay stage 330, respectively, of clock generator 300.

Conversely, responsive to math engine circuit 340 determining that the delay computed in process 422 for the current output clock cycle does not exceed the integer boundary (decision 423 returns a "no" result), process 426 is executed to apply phase adjustment code PH_ADJ_CODE with the unchanged value of integer component INT_VAL and the maximum value of fine adjustment component PA_FINE for the current cycle.

In decision 427, math engine circuit 340 determines whether the delay indicated by phase adjustment word PHASE_ADJUST received in process 421 has been fully applied. If not (decision 427 is "no"), math engine circuit 340 again executes process 422 to compute phase adjustment code PH_ADJ_CODE with no change to integer component INT_VAL and the maximum value of fine adjustment component PA_FINE; decision 423 and, if necessary, recomputing process 424 are then again performed for the next output clock cycle. Once the delay indicated by phase adjustment word PHASE_ADJUST received in process 421 has been fully applied (decision 427 is "yes"), generation of the output clock continues in process 428 for subsequent cycles using the previous value (e.g., nominal value M) of divider ratio DIV_VAL with no phase adjustment applied.

This alternative implementation described relative to FIG. 4B provides the capability of adjusting the phase of the output clock (e.g., device clock DCLK or system reference signal SYSREF) in a more gradual manner, as may be suitable for those applications in which downstream circuitry may be sensitive to large phase jumps in their clock signals.

According to these example embodiments, a phase offset or phase adjustment may be glitchlessly, predictably, and accurately applied by a clock generator circuit in its generation of an output clock, such as a device clock or system reference signal. In a system in which a single reference clock, such as a high-frequency clock generated by a digital phase-locked loop, is used to generate multiple clock signals within a "clock domain," such as in a system incorporating a serial interface according to the JESD204B/C standards, the example embodiments enable the phase offset or adjustment to be applied to the generation of one clock in that clock domain without requiring the resetting and re-synchronizing of other clocks in that domain. In addition, example embodiments provide the capability of dynamic phase correction, over a wide phase correction range yet at very fine fractional resolution, with that dynamic phase correction applied in as few as a single cycle of the output clock. Furthermore, the use of synchronous logic in the integer divider of a clock generator according to these example embodiments enables the phase offset to be applied with minimal timing glitches.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A clock generator circuit, comprising:
    an integer divider, having a first input operable to receive a reference clock, the integer divider configured to generate, at an output, an intermediate clock at a frequency divided down from a frequency of the reference clock by an integer value received at a second input;
    a digital delay stage, having a first input coupled to the output of the integer divider, the digital delay stage configured to generate, at an output of the digital delay stage, a delayed intermediate clock delayed from the intermediate clock by a number of fractional cycles of the reference clock selected responsive to a fractional cycle value received at a second input of the digital delay stage;
    an analog delay stage, having a first input coupled to the output of the digital delay stage, the analog delay stage configured to generate, at an output of the analog delay stage, an output clock delayed from the delayed intermediate clock by a delay value selected responsive to a fine adjustment value received at a second input of the analog delay stage; and
    math engine circuitry, having a first input operable to receive a phase adjustment word, and one or more outputs coupled to the second input of the integer divider, the second input of the digital delay stage, and the second input of the analog delay stage, the math engine circuitry configured to compute a phase adjustment code responsive to the phase adjustment word, the phase adjustment code comprising the integer value, the fractional cycle value, and the fine adjustment value.

2. The clock generator circuit of claim 1, wherein the integer divider comprises:
    counter circuitry having an input coupled to receive the reference clock, and configured to generate the intermediate clock responsive to a selected count at the counter circuitry; and
    ratio update logic, coupled to the second input of the integer divider, and configured to set the selected count for the counter circuitry responsive to the integer value of the phase adjustment code.

3. The clock generator circuit of claim 2, wherein the selected count is selected responsive to the integer value from over a first range of reference clock cycles;
    wherein the number of fractional cycles is selected responsive to the fractional cycle value from among a number of fractional reference clock cycles within a second range, the second range narrower than the first range;
    and wherein the delay value is selected responsive to the fine adjustment value from among a number of delay steps within a third range of reference clock cycles, each delay step corresponding to a shorter delay than a fractional reference clock cycle, and the third range narrower than the second range.

4. The clock generator circuit of claim 1, wherein the digital delay stage comprises:
    a plurality of clocked latches coupled in series, a first one of the clocked latches having a data input coupled to receive the intermediate clock from the integer divider, each of the clocked latches having a clock input coupled to receive the reference clock; and
    a multiplexer, having a plurality of inputs, each coupled to an output of one of the plurality of clocked latches, having a select input coupled to receive a select signal corresponding to the fractional cycle value, and having an output coupled to the output of the digital delay stage.

5. The clock generator circuit of claim 4, wherein the digital delay stage further comprises:
    a select circuit having an input coupled to the second input of the digital delay stage and an output coupled to the select input of the multiplexer, the select circuit configured to apply the select signal at its output responsive to the fractional cycle value.

6. The clock generator circuit of claim 1, wherein the analog delay stage comprises:
    a phase interpolator having an input coupled to receive the delayed intermediate clock from the digital delay stage, and having an output presenting the output clock; and
    a phase interpolation encoder, having an input coupled to the second input of the analog delay stage and an output coupled to the phase interpolator, the phase interpolation encoder configured to apply a signal to the phase interpolator indicating the delay value selected responsive to the fine adjustment value.

7. The clock generator circuit of claim 6, wherein the digital delay stage comprises:
a plurality of clocked latches coupled in series, a first one of the clocked latches having a data input coupled to receive the intermediate clock from the integer divider, each of the clocked latches having a clock input coupled to receive the reference clock;
a multiplexer, having a plurality of inputs, each coupled to an output of one of the plurality of clocked latches, having a select input coupled to receive a select signal corresponding to the fractional cycle value, and having an output coupled to the output of the digital delay stage; and
a select circuit having an input coupled to the second input of the digital delay stage and an output coupled to the select input of the multiplexer, the select circuit configured to apply the select signal at its output responsive to the fractional cycle value;
wherein the integer divider comprises a timing circuit configured to generate a timing clock corresponding to the intermediate clock;
and wherein each of the select circuit of the digital delay stage and the phase interpolation encoder of the analog delay stage are clocked by the timing clock.

8. The clock generator of claim 7, further comprising
a clocked buffer, coupled between the output of the math engine circuit and the second input of the integer divider, the clocked buffer configured to present the integer value to the integer divider when clocked by the timing clock.

9. A method of generating an output clock based on a reference clock having a frequency, the method comprising:
generating, in a first plurality of output clock cycles, the output clock at a frequency divided down from the frequency of the reference clock according to a divide ratio;
receiving a phase adjustment word indicating a phase adjustment to be applied to the output clock;
computing, responsive to the phase adjustment word, a phase adjustment code comprising at least one of an integer value component, a fractional cycle component, and a fine adjustment component;
applying the phase adjustment code, comprising at least one of:
applying the integer value component to an integer divider in a clock generator;
applying the fractional cycle component to a digital delay stage in the clock generator; and
applying the fine adjustment component to an analog delay stage in the clock generator;
generating a phase-offset output clock cycle with a phase offset corresponding to the applied phase adjustment code, using the clock generator; and
generating, in a second plurality of output clock cycles following the phase-offset clock cycle, the output clock at a frequency divided down from the frequency of the reference clock according to the divide ratio.

10. The method of claim 9, wherein the steps of generating the output clock in the first and second pluralities of output clock cycles each comprise:
applying the divide ratio to the integer divider; and
using the integer divider in generating the plurality of output clock cycles.

11. The method of claim 9, wherein the step of applying the phase adjustment code to a clock generator comprises:
performing the steps of applying the integer value component, applying the fractional cycle component, and applying the fine adjustment component in a single output clock cycle.

12. The method of claim 9, wherein the step of computing the phase adjustment code is performed for a plurality of phase-offset output clock cycles, so that the phase adjustment code for each of the plurality of phase-offset output clock cycles corresponds to a portion of the phase adjustment indicated by the phase adjustment word;
and wherein the step of applying the phase adjustment code comprises applying the phase adjustment code corresponding to a portion of the phase adjustment for each of the plurality of phase-offset output clock cycles.

13. The method of claim 12, wherein the step of computing the phase adjustment code comprises:
computing, for each of a plurality of phase-offset output clock cycles, a phase adjustment code consisting of the fine adjustment component at a selected value;
and wherein the step of applying the phase adjustment code comprises, for each of the plurality of phase-offset output clock cycles:
applying the fine adjustment component to the analog delay stage in the clock generator.

14. The method of claim 13, wherein the selected value of the fine adjustment component corresponds to a maximum delay of the analog delay stage.

15. The method of claim 14, wherein the step of computing the phase adjustment code further comprises:
determining, for each of the plurality of phase-offset output clock cycles, if application of the selected value of the fine adjustment component in that output clock cycle would exceed an integer boundary; and
responsive to determining that application of the selected value would exceed the integer boundary, computing the phase adjustment code for that output clock cycle to include the integer component at an incremented value and the fine adjustment component at a recomputed selected value.

16. A system, comprising:
a reference clock source, configured to generate a reference clock and provide the reference clock at an output;
a plurality of clock generators, each having an input coupled to the output of the reference clock source and operable to receive the reference clock, each of the plurality of clock generators configured to generate at least one output clock based on the reference clock and output the at least one output clock at a respective output of the clock generator; and
a plurality of integrated circuits, each having one or more inputs coupled to the respective output of one of the plurality of clock generators and operable to receive the at least one output clock from the one of the plurality of clock generators; and
wherein a first one of the plurality of clock generators comprises:
an integer divider, having a first input coupled to the output of the reference clock source, the integer divider configured to generate, at an output of the integer divider, an intermediate clock at a frequency divided down from a frequency of the reference clock by an integer value received at a second input of the integer divider;
a digital delay stage, having a first input coupled to the output of the integer divider, the digital delay stage configured to generate, at an output of the digital delay stage, a delayed intermediate clock delayed from the intermediate clock by a number of fractional cycles of the reference clock selected responsive to a fractional cycle value received at a second input of the digital delay stage;

an analog delay stage, having a first input coupled to the output of the digital delay stage, the analog delay stage configured to generate, at an output of the analog delay stage, an output clock delayed from the delayed intermediate clock by a delay value selected responsive to a fine adjustment value received at a second input of the analog delay stage; and math engine circuitry, having a first input operable to receive a phase adjustment word, and one or more outputs coupled to the second input of the integer divider, the second input of the digital delay stage, and the second input of the analog delay stage, the math engine circuitry configured to compute a phase adjustment code responsive to the phase adjustment word, the phase adjustment code comprising the integer value, the fractional cycle value, and the fine adjustment value.

17. The system of claim 16, further comprising:
a serial data interface coupled between a first one of the plurality of integrated circuits associated with the first one of the plurality of clock generators and a second one of the plurality of integrated circuits.

18. The system of claim 17, wherein the serial data interface operates according to a JESD204 standard;
and wherein the first one of the plurality of clock generators associated with the first one of the plurality of integrated circuit functions is configured to generate a first output clock corresponding to a device clock and a second output clock corresponding to a system reference signal.

19. The system of claim 16, wherein the integer divider of the first clock generator comprises:
counter circuitry having an input coupled to the output of the reference clock source, and configured to generate the intermediate clock responsive to a selected count at the counter circuitry; and
ratio update logic, coupled to the second input of the integer divider, and configured to set the selected count for the counter circuitry responsive to the integer value of the phase adjustment code;
wherein the selected count is selected responsive to the integer value from over a first range of reference clock cycles;

wherein the number of fractional cycles is selected responsive to the fractional cycle value from among a number of fractional reference clock cycles within a second range, the second range narrower than the first range;
and wherein the delay value is selected responsive to the fine adjustment value from among a number of delay steps within a third range of reference clock cycles, each delay step corresponding to a shorter delay than a fractional reference clock cycle, and the third range narrower than the second range.

20. The system of claim 19, wherein the analog delay stage comprises:
a phase interpolator having an input coupled to the output of the digital delay stage to receive the delayed intermediate clock, and having an output presenting the output clock; and
a phase interpolation encoder, having an input coupled to the second input of the analog delay stage and an output coupled to the phase interpolator, the phase interpolation encoder configured to apply a signal to the phase interpolator indicating the delay value selected responsive to the fine adjustment value;
wherein the digital delay stage comprises:
a plurality of clocked latches coupled in series, a first one of the clocked latches having a data input coupled to the output of the integer divider to receive the intermediate clock, each of the clocked latches having a clock input coupled to the output of the reference clock source;
a multiplexer, having a plurality of inputs, each coupled to an output of one of the plurality of clocked latches, having a select input operable to receive a select signal corresponding to the fractional cycle value, and having an output coupled to the output of the digital delay stage; and
a select circuit having an input coupled to the second input of the digital delay stage and an output coupled to the select input of the multiplexer, the select circuit configured to apply the select signal at its output responsive to the fractional cycle value;
wherein the integer divider comprises a timing circuit configured to generate a timing clock corresponding to the intermediate clock;
and wherein each of the select circuit of the digital delay stage and the phase interpolation encoder of the analog delay stage are clocked by the timing clock.

* * * * *